June 17, 1969 A. N. SAXENA 3,450,958

MULTI-PLANE METAL-SEMICONDUCTOR JUNCTION DEVICE

Filed Jan. 10, 1967

United States Patent Office 3,450,958

Patented June 17, 1969

3,450,958

MULTI-PLANE METAL-SEMICONDUCTOR JUNCTION DEVICE

Arjun N. Saxena, Williamstown, Mass., assignor to Sprague Electric Company, North Adams, Mass., a corporation of Massachusetts Filed Jan. 10, 1967, Ser. No. 608,375
Int. Cl. H01l 3/00, 9/00
U.S. Cl. 317—234 6 Claims

ABSTRACT OF THE DISCLOSURE

A metal in contact with a plurality of crystallographic planes of a semiconductive wafer provide a junction having a distribution in barrier height and width, and consequently, low turn-on voltage.

*Background of the invention*

The present invention relates to semiconductor devices and more particularly to planar metal-semiconductor junction devices.

Planar metal-semiconductor junction devices, such as diodes, in which a metal film forms an essentially planar junction with the semiconductive material and extends over a passivating layer to an ohmic contact, are preferred for reliability, reproducibility and ruggedness as compared to point contact devices. However, the planar construction provides a device having higher turn-on voltage and lower reverse current as compared to point contact devices. These characteristics result in a higher local oscillator power requirement when used as mixers and in a difference of R.F. and I.F. impedances so that the planar device cannot be utilized as a direct replacement for the latter.

*Summary of the invention*

A metal-semiconductor device provided in accordance with the invention comprises a junction formed between a metal and a plurality of crystallographic planes of a semiconductive wafer such that a distribution in barrier height and width is provided.

In a preferred embodiment, the plurality of crystallographic planes are provided by a eutectic interface formed from the metal and crystal. In further embodiments the planes are provided by a selectively etched or an abraded surface of the wafer.

It is an object of this invention to provide a planar metal-semiconductor junction device having low turn-on voltage.

It is another object of this invention to provide a planar metal-semiconductor junction diode having electrical characteristics similar to those of the point contact diode.

*Description of the preferred embodiments*

Figure 1:
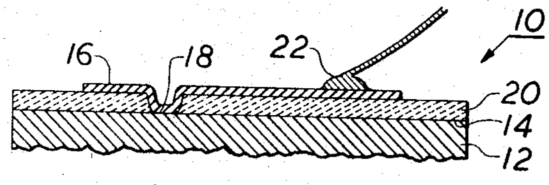
FIGURE 1 is a view in section of a metal-semiconductor diode.

Referring now to FIGURE 1, a planar diode 10 constructed in accordance with the invention is shown. Therein, a wafer 12 of monocrystalline material, such as silicon or the like, is illustrated as having an upper surface 14 in contact with a metal film 16, thereby forming a planar metal-semiconductor junction 18.

A protective or passivating coating 20, of silicon oxide or the like, covers a large portion of surface 12 so as to confine the junction 18 to a small area and to protect it from ambient conditions. A lead 22 of gold, nickel, or other suitable conductor, provides an ohmic contact with the metal film, whereas connection to wafer 12 may be provided in any conventional manner, such as by alloying a suitable preform (not shown).

For the most part, conventional planar techniques are employed in this construction, with however, modifications designed to provide a non-uniform barrier at junction 18. Thus, as in conventional planar technology, a protective coat 20 is deposited by oxidation, or the like, over wafer 12. Thereafter, a small opening is made through the coating to wafer surface 14 by etching, or the like, and a metal film 16 then deposited by evaporation in a vacuum system, or chemical vapor deposition, or the like, over the oxide coating 20 and within the opening of the coating, where it contacts surface 14 and forms junction 18.

Figures 2, 3:
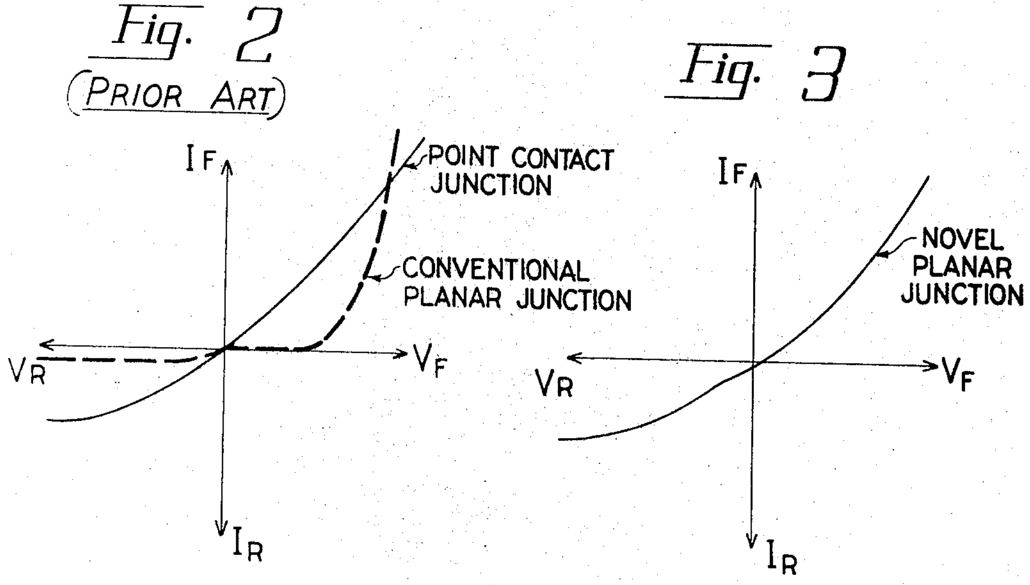
Fig. 2 (PRIOR ART) Fig. 3
FIGURE 2 is a graph of the current versus voltage characteristics of prior art point contact and planar metal-semiconductor diodes.
FIGURE 3 is a graph of the current versus voltage characteristics of a diode provided in accordance with the invention.

A planar metal-semiconductor junction, constructed without the novel non-uniform barrier, will provide a current versus voltage characteristic as shown in FIGURE 2, which also includes that of the point contact construction. The current scale in the reverse direction is magnified by several orders of magnitude in this figure as compared to the current scale in the forward direction. As demonstrated by this graph, devices utilizing these junctions are not readily interchangeable since conventional planar junctions have a considerably higher turn-on voltage and lower leakage current than that of the point contact device whose characteristics are due to the exceptionally large pressure exerted at the point junction by the force applied to the whisker. Of course, the conventional planar metal-semiconductor junction does not have such force.

A junction made in accordance with planar techniques but including the inventive modifications, which ensure a distribution in barrier height and width, provides current and voltage characteristics as shown in FIGURE 3. As can be seen from this figure, characteristics of the distributed barrier junction are similar to the turn-on voltage and reverse current value of the point contact and would be generally interchangeable with it.

Since the barrier height at the metal-semiconductor junction depends upon the crystallographic orientation of the semiconductor, a distribution in height and width of the barrier may be obtained by providing a plurality of crystallographic planes at the interface.

Figure 4:
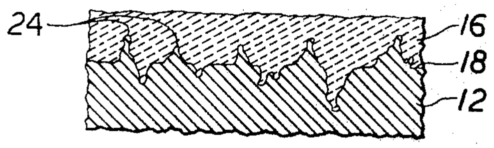
FIGURE 4 is a detail of the metal-semiconductor junction of FIGURE 1 provided in accordance with one embodiment.

In the preferred embodiment the indicated plurality of crystallographic planes is provided, as shown in FIGURE 4, by crystal needles 24 which extend into a eutectic interface. In this construction, the temperature of the previously formed metal semiconductor junction 18 is raised above the eutectic temperature corresponding to that binary system to form a liquid alloy or eutectic (not shown) of the metal and semiconductor at the interface. Thereafter as the system is cooled to a temperature below the eutectic temperature, the mixture solidifies yielding a eutectic composition of metal and semiconductor over most of the junction area.

Since the grain size depends upon the rate of cooling, semiconductive regions 24 extend from the substrate into the eutectic and expose crystallographic planes to the metal which, in general, will be different from the crystallographic plane of the wafer, which is usually (111).

Various metals, such as silver and copper, and semiconductive materials such as silicon and germanium are suitable. For example, an Ag-Si diode was provided in the described manner, by first forming a metal-semiconductor junction between a film of Ag and an Si wafer. Thereafter this junction was raised above the eutectic temperature, to 840° C. in this case, and cooled to give an Ag-Si eutectic interface.

As shown in FIGURE 4, Si needles 24 extend from the wafer into the eutectic mixture at the interface. The crystallographic planes along the sides of the needles being different than the (111) plane of the wafer a distribution in barrier height and width was achieved. A diode made in this manner provided current versus voltage characteristics, as shown in FIGURE 3, which are similar to those of the point contact diode.

However, in contrast to point contact junctions which employ an externally applied force on the whisker, the novel unit described here utilizes the varied crystallographic planes at the interface to provide the desired barrier distribution, while at the same time retaining other advantages of the planar construction.

Other characteristics of the point contact diode, such as the low junction capacitance, can also be provided in the planar construction as, for example, by restricting the junction area 18 to the order of 0.1 mil diameter, which is entirely feasible with present photolithographic techniques.

Advantageously, the novel planar metal-semiconductor junction, although most useful in the described diode construction, is also applicable to other devices where a distribution in barrier heights and widths is desired, for example, in any device where a low turn-on voltage is useful.

Other means of providing the plurality of crystallographic planes at the junction interface are also applicable. For example, since the etching rate of some etching solutions is different along different crystallographic planes, surface 14 of the wafer may be selectively etched in the junction area to expose planes other than the (111) plane of this surface.

Figure 5:
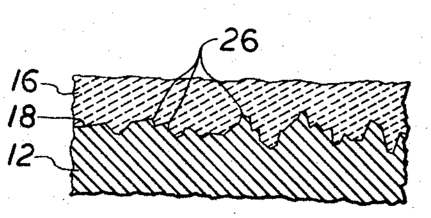
FIGURE 5 is a detail of the metal-semiconductor junction of another embodiment.

Once a variety of planes is provided at surface 14, the metal film 16 which may be gold, nickel, silver, etc., is then deposited by conventional techniques to provide a rectifying junction 18, as shown in detail in FIGURE 5.

For example, an etching solution, such as 10% pyrocatechol in hydrazine at a temeprature of about 80° C., delineates various planes of surface 14 and causes a multiplicity of barrier heights and widths when a junction 18 is later provided with the metal film 16.

In this construction, high field points 26, which occur at the intersection of the surface planes, also introduce excess carrier flow across the junction and provides a further lowering of the turn-on voltage. The barrier conditions resemble those present in the point contact diode, and thus, a diode made according to this technique should have characteristics similar to the former.

In a similar manner, a plurality of crystallographic planes may also be provided by abrasion (not shown) of the crystal surface 14. This abrasion, which is also carried out before deposit of the metal film, introduces damage to the crystal lattice which has the effect of delineating a variety of planes on the surface in a random manner. The rectifying junction, thereafter formed on the delineated surface by deposit of the metal 16, will also have a distribution in barrier height and width, and consequently, low turn-on voltage and other characteristics similar to a point contact diode.

The metal-semiconductor junction formed with a variety of crystallographic planes providing peaks as described, may be employed in many different devices, and many modifications are possible without departing from the spirit and scope of the invention described herein. Thus, it should be understood that the invention is not to be limited except as in the appended claims.

What is claimed is:

1. A metal-semiconductor junction device comprising a wafer of monocrystalline semiconductive material and a metal in contact with each other to form a substantially planar metal-semiconductor junction, and said wafer having a plurality of random crystallographic planes including peaks formed by the intersection of said planes in contact with said metal throughout most of the area of the junction interface thereby providing a distribution in barrier height and width of said junction.

2. A device as claimed in claim 1 in which said junction interface is a eutectic mixture of said metal and wafer, and said plurality of crystallographic planes is provided by portions of said wafer which extend into said eutectic interface.

3. A device as claimed in claim 1 in which said peaks have sharp points formed by said intersection.

4. A device as claimed in claim 1 including a passivating coating overlying the surface of said wafer adjacent said junction thereby sealing said junction.

5. A device as claimed in claim 1 in which said wafer has a delineated surface in contact with said metal for providing said plurality of crystallographic planes.

6. A device as claimed as claim 1 in which said wafer has a randomly delineated surface in contact with said metal for providing said plurality of crystallographic planes.

References Cited

UNITED STATES PATENTS

| | | | |
|---|---|---|---|
| 3,075,892 | 1/1963 | John et al. | 117—200 |
| 3,232,800 | 2/1966 | Mihara et al. | 317—234.7 |
| 3,295,185 | 1/1967 | Pritchard et al. | 317—234.5 |

JOHN W. HUCKERT, *Primary Examiner*.

J. D. CRAIG, *Assistant Examiner*.

U.S. Cl. X.R.

29—590; 148—1.5, 33, 33.3